(12) United States Patent
Abe et al.

(10) Patent No.: US 7,723,916 B2
(45) Date of Patent: May 25, 2010

(54) ORGANIC ELECTROLUMINESCENCE ELEMENT AND DISPLAY USING THE SAME

(75) Inventors: Yuko Abe, Tokyo (JP); Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 135 days.

(21) Appl. No.: 12/077,662

(22) Filed: Mar. 19, 2008

(65) Prior Publication Data

US 2008/0231179 A1    Sep. 25, 2008

(51) Int. Cl.
*H01J 1/62* (2006.01)
(52) U.S. Cl. ........................ 313/506; 313/498
(58) Field of Classification Search .......... 313/504, 313/506
See application file for complete search history.

(56) References Cited

U.S. PATENT DOCUMENTS 6,351,067 B2 * 2/2002 Lee et al. .............. 313/504
7,169,482 B2 * 1/2007 Aziz et al. ............. 428/690
2006/0255722 A1 * 11/2006 Imanishi ............... 313/504

FOREIGN PATENT DOCUMENTS

| JP | 2000-068065 | 3/2000 |
|---|---|---|
| JP | 2005-251639 | 9/2005 |
| JP | 2006-114759 | 4/2006 |

* cited by examiner

*Primary Examiner*—Joseph L Williams
*Assistant Examiner*—Brenitra M Lee
(74) *Attorney, Agent, or Firm*—Squire, Sanders & Dempsey L.L.P.

(57) ABSTRACT

One embodiment of the present invention is an organic electroluminescence element, including: an anode; a cathode; an organic light emitting medium layer including a buffer layer and an organic light emitting layer, the organic light emitting medium layer being between the anode and the cathode, and the buffer layer comprising at least two kinds of inorganic material.

20 Claims, 7 Drawing Sheets

300

ORGANIC ELECTROLUMINESCENCE ELEMENT AND DISPLAY USING THE SAME

CROSS REFERENCE

This application claims priority to Japanese application number 2007-076459, filed on Mar. 23, 2007, which is incorporated herein by reference.

BACKGROUND OF THE INVENTION

1. Field of the Invention

The present invention is related to an organic electroluminescence (light emitting) element and a display having the element. In particular, the present invention is related to an organic electroluminescence element having an organic light emitting medium layer of a layered product structure comprised of a polymer compound and an inorganic compound and a display having the element.

2. Description of the Related Art

In organic electroluminescence (organic EL) elements, a voltage is applied to an electrically conductive organic light emitting medium layer, and thus electrons injected from a cathode and holes from an anode are allowed to recombine, whereby an organic light emitting material which makes up the organic light emitting layer is allowed to emit light upon this recombination. (Here, an organic light emitting layer with a hole transport layer, a hole injection layer, an electron transport layer or an electron injection layer is called an organic light emitting medium layer.) For extracting the light outside concurrently with applying the voltage to the organic light emitting layer, a construction including a first electrode and a second electrode placed on both sides of the organic light emitting medium layer is provided. This device is constructed by sequentially laminating the first electrode, the organic light emitting medium layer and the second electrode on a transparent board. In general, the first electrode formed on the board is used as an anode, while the second electrode formed on the organic light emitting medium layer is used as a cathode.

An exemplary organic light emitting medium layer may include copper phthalocyanine used as a hole injection layer, N,N'-di(1-naphthyl)-N,N'-diphenyl-1,1'-biphenyl-4,4'-diamine used as a hole transport layer, and tris(8-quinolinol) aluminum used as a luminescent layer, respectively. Furthermore, in an attempt to increase light emitting efficiency, the construction of an organic EL element is often made by providing the hole transport layer and the hole injection layer between the anode and the organic light emitting layer, or the electron transport layer and the electron injection layer between the organic light emitting layer and the cathode, which may be selected ad libitum. Any of the substances which constitute the organic light emitting medium layer and allow the layer to function (light emitting medium material) is a low molecular compound, each layer having a thickness of approximately 1 to 100 nm, and deposited by a vacuum evaporation method such as resistance heating.

To the contrary, there are polymer organic EL elements in which a polymer material is used as the organic light emitting medium layer. In the light emitting layer, a low molecular light-emitting material dissolved in a polymer such as polystyrene, polymethyl methacrylate or polyvinyl carbazole, as well as a polymer light emitter such as a polyphenylenevinylene derivative (PPV), a polyalkylfluorene derivative (PAF) or the like may be used. These polymer materials can be subjected to film formation by a wet method such as a coating method or a printing method through dissolving or dispersing in a solvent. Therefore, it is advantageous in that film production is enabled under an ambient air pressure with low equipment costs as compared to the organic EL element in which a low molecular material is used.

In the polymer organic EL element, a hole transport layer is generally provided for the purpose of lowering the voltage to be applied. In typical examples, film formation is carried out using a polymer material ink of a donating molecule and an accepting molecule aggregate which were dispersed in water. It is known that the hole transport layer shows superior charge injection properties. However, in a hole transport layer comprised of a polymer material, since the resistance of the film is high, the film is highly loaded in a high voltage region. Thereby the material itself deteriorates. Therefore, there is a problem in that luminance and electric current density are limited. In this way, the element using the hole transport layer comprised of a polymer material has a resistance problem and there are concern points such as deterioration of light emitting characteristics or reduced life-time.

In addition, it has been proposed that inorganic products such as an oxide, a nitride and an oxynitride of a transition metal, and a p-type compound semiconductor are used for a hole transport layer. In this case, more stable characteristics are obtained than in the case using a polymer material especially in the case of a high voltage and a high luminance region. However, an electron blocking layer comprised of a polymer material between a hole injection layer and a light emitting layer is necessary in order to achieve a high efficiency. (Patent Document 1)

Here, layers such as the above-mentioned hole transport layer, the hole injection layer and the electron blocking layer, the layers being between an electrode and an organic light emitting layer and the layer provided for improving characteristics, are called buffer layers.

Further, in general, the thickness of the electron blocking layer is thinner than the thickness of an organic light emitting medium layer so that an increase in the applied voltage is prevented. Especially, in the case where a display having pixels sectioned for a pixel is manufactured, there are many problems to be solved in order to realize a uniformity of films both inside and outside a pixel when a polymer material is used.

In view of the above-mentioned problems, the object of the present invention is to provide a buffer layer without ununiformity, and to further provide a polymer organic EL element having a high reliability by using a buffer layer having a good resistance and a high stability.

Hereinafter, a known related art is described.

[Patent Document 1] JP-A-2006-114759

SUMMARY OF THE INVENTION

One embodiment of the present invention is an organic electroluminescence element, including an anode, a cathode, an organic light emitting medium layer including a buffer layer and an organic light emitting layer, the organic light emitting medium layer being between the anode and the cathode, and the buffer layer including at least two kinds of inorganic material. The buffer layer is a layer comprised of a hole transport layer and a functional layer. In this case, a stable organic EL element being superior in thermal stability and resistance can be obtained. In addition, in the case where at least two kind of inorganic materials are used, a carrier transport or injection function and a carrier blocking function are easily controlled. Thereby, an organic EL element having a higher efficiency can be obtained.

Another embodiment of the present invention is an organic electroluminescence element wherein the organic light emitting material comprises a polymer compound. Another embodiment of the present invention is an organic electroluminescence element wherein the anode and the cathode are a transparent electrode and a counter electrode.

Another embodiment of the present invention is an organic electroluminescence element wherein the buffer layer is formed on the anode side and the organic light emitting layer is formed on the cathode side In this case, hole injection from an anode is easily performed.

Another embodiment of the present invention is an organic electroluminescence element wherein the buffer layer is a layered product including at least two kinds of inorganic material. In addition, if an effect of the buffer layer in the present invention is obtained, other embodiments, for example, a mixture as well as the layered product can be used. In this case, a carrier transport or injection function and a carrier blocking function can be easily adjusted by adjusting the film thickness or selecting an appropriate material.

Another embodiment of the present invention is an organic electroluminescence element wherein the layered product includes a hole transport layer provided on the anode side and a functional layer having at least one of the following functions, a hole injection function and an electron blocking function, the functional layer being provided on the organic light emitting layer side. (The functional layer is called a hole injection layer or an electron blocking layer according to the function.) In this case, hole injection to the organic light emitting layer can be easily performed and a driving voltage can be lowered. In addition, since the functional layer has an electron blocking function, a hole and an electron can easily recombine inside an organic light emitting layer. Thereby, light emitting efficiency can be improved.

Another embodiment of the present invention is an organic electroluminescence element wherein the functional layer has the electron blocking function, and wherein an absolute value of an electron affinity value of the functional layer is smaller than an absolute value of an electron affinity value of the organic light emitting layer. In this case, a proper electron blocking function can be obtained. Thereby, an organic EL element having a higher efficiency can be obtained.

Another embodiment of the present invention is an organic electroluminescence element wherein the functional layer has the hole injection function, and wherein an absolute value of a work function of the functional layer is larger than an absolute value of a work function of the organic light emitting layer. In the case where an absolute value of a work function value of the functional layer is larger than an absolute value of a work function value of the organic light emitting layer, a barrier in the case of hole transporting or injection becomes small. Thereby, reduction of a driving voltage of an organic electroluminescence element is possible.

Another embodiment of the present invention is an organic electroluminescence element wherein at least one of the following layers, the hole transport layer and the functional layer, includes an oxide of a transition metal. In this case, since there are a plurality of potential levels, hole transporting and injecting can be easily performed. Thereby, reduction of a driving voltage is possible. In addition, the adjustment of a valence of a metal makes it possible to adjust a potential level of the functional layer or a hole injection layer.

Another embodiment of the present invention is an organic electroluminescence element wherein at least one of the following layers, the hole transport layer and the functional layer, includes a nitride of a transition metal. The use of a rigid nitride of a transition metal for at least one of the above mentioned layers makes it possible to manufacture an organic EL element having a high stability.

Another embodiment of the present invention is an organic electroluminescence element wherein at least one of the following layers, the hole transport layer and the functional layer, includes an oxynitride of a transition metal. In this case, a more stable organic EL element can be obtained. In addition, the adjustment of a valence of a metal makes it possible to adjust a potential level of the functional layer or a hole injection layer.

Another embodiment of the present invention is an organic electroluminescence element wherein at least one of the following layers, the hole transport layer and the functional layer, includes a p-type compound semiconductor of a III-V group element. In this case, a hole transport layer and an electron blocking layer or a hole injection layer can be obtained, those layers having little change in electrical characteristics due to a flowing current or a temperature, not reacting electrochemically with a material of the electrode and further being superior in translucency.

Another embodiment of the present invention is an organic electroluminescence element wherein the functional layer includes one of the following oxides, molybdenum oxide, nickel oxide and tungsten oxide. In this case, a stable functional layer superior in a hole injection function or an electron blocking function can be obtained.

Another embodiment of the present invention is an organic electroluminescence element wherein the hole transport layer includes one of the following oxides, molybdenum oxide, nickel oxide and tungsten oxide. In the case where the hole transport layer includes at least one of the following, molybdenum oxide, vanadium oxide, gallium arsenide and silicon carbide, a hole transport layer superior in a carrier transporting property or translucency can be obtained.

Another embodiment of the present invention is an organic electroluminescence element wherein the organic light emitting layer is formed by a wet method. In this case, cost reduction in a film formation of an organic light emitting layer is possible. In addition, since an organic light emitting layer is formed by a wet process between an inorganic layer formed by a dry process and an electrode, a projection or a defect due to the inorganic layer or the electrode can be covered and a short-circuit can be reduced.

Another embodiment of the present invention is an organic electroluminescence element wherein at least the anode or the cathode is a pixel electrode. In the case where at least the anode or the cathode is a pixel electrode, an active matrix driving type organic EL element can be obtained.

Another embodiment of the present invention is a display having the organic electroluminescence element of one embodiment of the present invention as a display element. In this case, a display having a higher efficiency and stability and having good display characteristics can be obtained.

Figure 1:
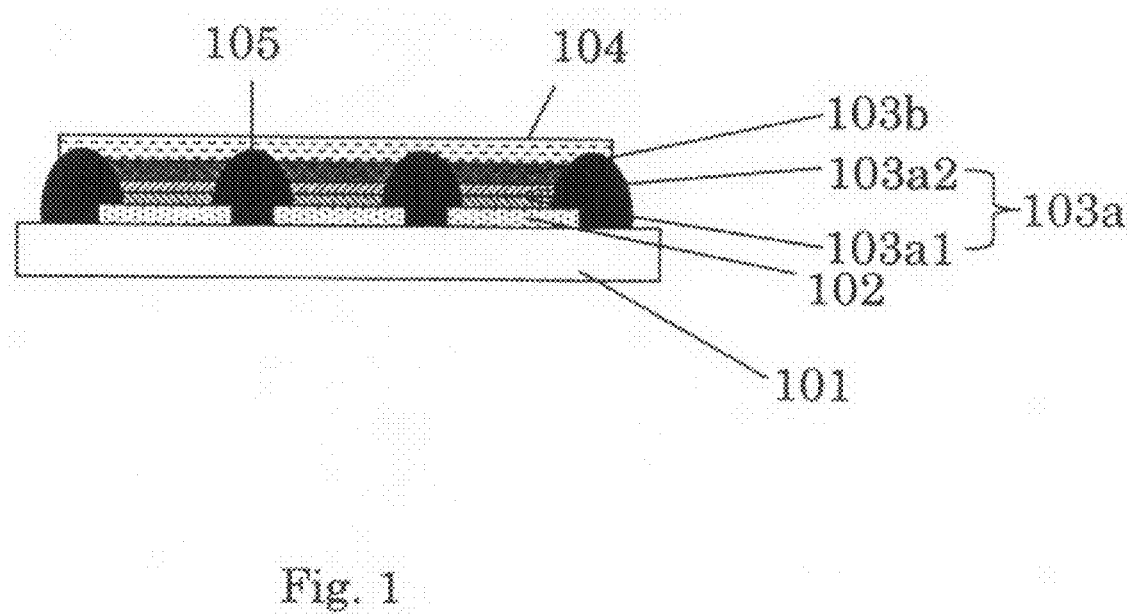
FIG. 1 is an explanatory diagram showing a structure of an organic EL element of the present invention.

In these drawing, 101 and 201 each are a transparent substrate; 102 and 202 each are a transparent conductive layer; 103 and 203 each are an organic light emitting medium layer; 103a and 203a each are a buffer layer; 103a1 and 203a1 each are a hole transport layer; 103a2 and 203a2 each are an electron blocking layer; 103b and 203b each are an organic light emitting layer; 104 and 204 each are a counter electrode; 105 and 205 each are an insulating partition wall; 1 is a display region; 2 is a counter electrode; 3 is a buffer layer; 3a is a hole transport layer; 3b is a functional layer; 4 is a display; 5 is a substrate; 6 is an active layer; 7 is a gate insulating film; 8 is a gate electrode; 9 is an interlayer dielectric; 10 is a source electrode; 11 is a scanning wiring; 12 is a drain electrode; 13 is a pixel electrode; 14 is a partition wall; 15 is an organic light emitting layer; 16 is an organic light emitting medium layer; 17 is an energy level of an anode; 18 is an energy level of a cathode; 19 is a hole transport layer; 20 is a functional layer; 21 is an organic light emitting layer; 22 is an interface between an anode and a hole transport layer; 23 is an interface between a hole transport layer and a functional layer; 24 is an interface between a functional layer and an organic light emitting layer; 25 is an interface between an organic light emitting layer and a cathode; 26 is an energy level of a work function value of a functional layer; 28 is an energy level of an electron affinity value of a functional layer; 29 is an energy level of a work function value of an organic light emitting layer; 30 is an energy level of an electron affinity value of an organic light emitting layer; 31 is a hole; 32 is an electron; 33 is an ink tank; 34 is an ink chamber; 35 is an anilox roll; 36 is an ink layer; 37 is a plate cylinder; 38 is a plate; 39 is a substrate to be printed; 40 is a flat base; 100 is an active matrix driving type organic EL display; 200 is a passive matrix driving type organic EL display; and 300 is a relief printing apparatus.

DETAILED DESCRIPTION OF THE INVENTION

Hereinafter, embodiments of the present invention are described referring to the figures. In addition, figures used for explaining the embodiment described below are figures used for explaining a constitution of the present invention. Thickness, dimension or the like of respective elements shown in the figure are different from actual sizes. In addition, the present invention is not limited to these.

Hereinafter, an example of an organic EL element of the present invention is described referring to FIG. 1.

A transparent substrate 101 (FIG. 1) in the invention is not particularly limited as long as it is a substrate having translucency and a certain level of strength, and specifically, a glass substrate, or a plastic film or sheet can be used. When a thin glass substrate having a thickness of 0.2 to 1 mm is used, a thin organic EL element having extremely high barrier properties can be produced.

A transparent conductive layer 102 is not particularly limited as long as it is formed with an electrically conductive material enabling formation of a transparent or translucent electrode. Specifically, a complex oxide of indium and tin (hereinafter, referred to as ITO) can be preferably used. The film can be formed on the transparent substrate 101 with a vapor deposition or sputtering method. Also, it can be formed by coating a precursor such as indium octylate or acetone indium on the substrate, followed by an application thermal decomposition method in which oxide is formed by thermal decomposition. Alternatively, a metal such as aluminum, gold or silver may be used after vacuum evaporation to give a translucent state. Alternatively, an organic semiconductor such as polyaniline can be also used.

The transparent conductive layer 102 as described above may be subjected to patterning by etching or to surface activation by a UV treatment, a plasma treatment or the like as needed.

When the organic EL element is manufactured to obtain a display that enables a matrix display, the transparent conductive layer 102 is formed in stripes, and by forming a counter electrode, which is formed across an organic light emitting medium layer, in stripes so as to be perpendicular to the transparent electrode, a passive matrix display can be obtained in which each intersection emits light. Also, an active matrix display can be obtained by forming thin film transistors so that they correspond to each picture element on the transparent substrate 101, and arranging the counter electrode that corresponds to each picture element so that each emits light thereto.

When the transparent conductive layer 102 is formed by etching to give a patterned shape, concern about a possible occurrence of a short between the transparent electrode and the counter electrode may be raised in the case in which the edge of the transparent conductive layer cannot be covered by the organic light emitting medium layer laminated thereon because there is, a large convex and a concave in the edge. Therefore, the end part of the transparent electrode is preferably covered by a resin having an insulating property. In order to cover the end part of the transparent electrode, for example, photosensitivity is imparted to a composition of a resin such as polyimide, acryl or polyurethane, which is coated, followed by mask exposure and development.

Additionally, when the height of the resin having the insulating property (designated as insulating partition 105) that covers the end part of the transparent electrode is higher than a certain value, for example, 0.5 μm or higher and 1.5 μm or lower, it plays a role in preventing the picture elements from color mixing when the organic light emitting medium layers formed according to adjacent transparent electrode patterns emit the light to develop different colors.

The organic light emitting medium layer 103 of the organic EL element according to the invention is not limited to the two-layer structure of a buffer layer 103a and the organic light emitting layer 103b (FIG. 1), but the structure further provided with an electron transport layer or an insulating layer can also exhibit the effect of the invention. Each layer may have an arbitrary thickness, but is preferably 0.1 nm to 200 nm, and it is preferred that the organic light emitting medium layer has a total film thickness of 50 nm to 500 nm.

For the buffer layer 103a, a layered product-structure including a hole transport layer 103a1 and an electron blocking layer 103a2, the both layers being comprised of at least two kinds of inorganic material, is adopted. (the function and/or the effect of the buffer layer are described below.)

An oxide, a nitride, an oxynitride and a p-type compound semiconductor of a transition metal can be used for a hole transport layer 103a1 comprised of an inorganic material. The film thickness of the hole transport layer 103a1 is arbitrary. However, it is desirable that the film thickness is 0.1 nm-200 nm. In addition, the film thickness of 0.1-70 nm is preferred in view of preventing a rise in a driving voltage. In addition, in the case of a material having a highly insulating property, a good hole transporting property is obtained by forming a film of 0.1-10 nm film thickness. Further, if a band gap of a material is equal to or more than 3.0 eV, the film is almost transparent in a visible light region. Thereby, EL characteristics more superior in chromaticity, luminance and efficiency in light emitting can be obtained.

Examples of an oxide of a transition metal used here include an oxide of chrome (Cr), tungsten (W), vanadium (V), niobium (Nb), tantalum (Ta), molybdenum (Mo), titanium (Ti), zirconium (Zr), hafnium (Hf), scandium (Sc), yttrium (Y), manganese (Mn), iron (Fe), ruthenium (Ru), osmium (Os), cobalt (Co), nickel (Ni), copper (Cu), zinc (Zn) and cadmium (Cd). A compound of a transition metal has a plurality of oxidation numbers. Therefore, there is a plurality of potential levels. Thus, hole injection becomes easy and reduction of a driving voltage becomes possible. Film formation can be performed mainly by a vacuum vapor deposition method or a sputtering method.

In addition, there are many kinds of nitride and many of them are used as a functional material. Film formation can be performed mainly by a sputtering method or a CVD method. Various compounds such as a material used for a semiconductor and a material having a very high insulating property are known. However, as a result of various tests, it was found that, in the case of a highly insulating property compound, if the film thickness was equal to or less than about 5 nm, carrier injection became possible. Examples of the compounds are described below. Titanium nitride (TiN) is preferable. TiN is known as a very rigid material and remains stable when heated.

Besides, magnesium nitride (MgN), molybdenum nitride (MoN), niobium nitride (NbN), tantalum nitride (TaN), vanadium nitride (BaN), zinc nitride (ZnN), zirconium nitride (ZrN), nitriding iron (FeN), copper nitride (CuN), chromium nitride (CrN), yttrium nitride (YN), titanium nitride (TiN) and these composite nitrides can be used.

Further, an organic EL element of the present invention includes an organic EL element in which a hole transport layer is comprised of a p-type compound semiconductor of III-V group element. Especially, as for SiC which is carbide of silicon (Si), a large-sized film formation is easy and control of a hole transporting property by doping is easy. In addition, there is little change of electric characteristics due to a flowing electric current or a temperature and there is no electrochemical reaction with a material of an electrode. Further, it is superior in transparency. In addition, since GaAs which is an arsenide of gallium (Ga) has a work function near a work function of ITO which is used for an anode, GaAs can be used for a hole transport layer. In this case, a film formation is possible by a vacuum vapor deposition method and so on. Besides, any III-V group element compound semiconductors can be used if the semiconductor has a work function near a work function of an anode material and an electron affinity value of the semiconductor is, less than that of a light emitting layer. A film formation thereof can be performed mainly by a vacuum vapor deposition method or a sputtering method.

An oxide, a nitride and a oxynitride of a transition metal, and p-type compound semiconductor of III, IV and V group element can be used for an electron blocking layer 103a2 comprised of an inorganic material. The film thickness of an electron blocking layer 103a2 is arbitrary. However, it is desirable that the film thickness is 0.1 nm-200 nm. In addition, the film thickness of 0.1-70 nm is preferred in view of preventing a rise in a driving voltage. In addition, in the case of a material having a highly insulating property, good EL characteristics are obtained by forming a film of 0.1-10 nm film thickness while hole injection to a light emitting layer is not prevented. Further, if a band gap of a material is equal to or more than 3.0 eV, the film is almost transparent in a visible light region. Thereby, EL characteristics more superior in chromaticity, luminance and efficiency in light emitting can be obtained.

The same material as the above-mentioned materials of a hole transport layer can be used for a material used for an electron blocking layer 103a2 comprised of an inorganic material. In this case, an electron blocking layer to prevent an electron injected to a light emitting layer from escaping to a hole transport layer side is necessary. Therefore, it is necessary that an electron affinity value of an electron blocking layer is smaller than that of a light emitting layer, or it is necessary that a material of an electron blocking layer is a material of a small electron transporting property. In addition, in the case where a work function value of an electron blocking layer is near that of a hole transport layer and a light emitting layer, good organic EL characteristics can be obtained while hole injection to a light emitting layer is not prevented.

For example, "a work function value/an electron affinity value" of NiO is 5.4 eV/1.9 eV. Therefore, NiO is a material superior in both a hole injection function and an electron blocking function. So, NiO is a material suitable for an electron blocking layer. Besides this, the above-mentioned SiC can also be used for an electron blocking layer.

In the case where a buffer layer has a layered product structure comprised of a hole transport layer and an electron blocking layer of an inorganic compound, a film formation of a hole transport layer and an electron blocking layer can be performed at the same time by a dry process, wherein it is not necessary for both layers to be separately coated for every pixel. Thereby, large reductions in the number of processes and costs are possible. In addition, a uniform buffer layer without film thickness ununiformity can be obtained, wherein an ununiform film thickness may occur in the case of a wet process. Further, the use of a buffer layer comprised of a highly stable inorganic material makes it possible to obtain a polymer organic EL element having a high reliability.

The light emitting material for use in the organic light emitting layer 103b may be anything as long as it is a material which is generally used as an organic light emitting material, and the film formation can be carried out using a coumarin-based, perylene-based, pyran-based, anthrone-based, porphyrin-based, quinacridone-based, N,N'-dialkyl-substituted quinacridone-based, naphthalimido-based, or N,N'-diaryl-substituted pyrrolopyrrole-based dissolved in a polymer such as polystyrene, polymethyl methacrylate or polyvinyl carbazole, as well as a PPV-based or PAF-based, polyparaphenylene-based polymer light emitter or the like.

These organic light emitting layers can be formed by a wet method using an organic light-emitting coating liquid prepared by dissolving or dispersing in a solvent such as toluene, xylene, acetone, anisole, methyl anisole, dimethyl anisole, mesitylene, methyl ethyl ketone, methyl isobutyl ketone, cyclohexanone, methanol, ethanol, isopropyl alcohol, ethyl acetate, butyl acetate or water alone or as a mixed solvent. In particular, an aromatic solvent such as toluene, xylene, anisole, methyl anisole, dimethyl anisole, ethyl benzoate, methyl benzoate or mesitylene is more preferred because it is favorable in solubility of the polymer light emitting material, and can be easily handled since the boiling point in atmospheric pressure is equal to or less than 180° C. Further, the solvent is preferred in view of removing the solvent after forming an organic light emitting medium layer. In addition, Detergent, antioxidant, UV absorber, viscosity modifier or the like can be added in the coating liquid forming an organic light emitting medium layer if necessary.

As for a light emitting layer provided on respective pixel portions, light emitting layers which emit light of an identical color can be arranged. In this case, a display of a single color can be manufactured. In the case where a color image is displayed, it is necessary to arrange pattern-shaped light emitting layers which emit different color lights from each other at respective pixel portions. In general, the colors are red (R), green (G) and blue (b) which are light's three primary colors. In addition, yellow (Y), Cyan (C) and Magenta (M) which are complementary colors thereof can be used.

When the film formation of the organic light emitting layer is carried out by a printing method, the coating can be performed by a printing method such as a relief printing method, an intaglio printing method, a screen printing method, a gravure printing method, a flexography method or an offset lithography method. However, the relief printing method is particularly suited for production of the organic EL element, in particular, in light of suitability to the viscosity region of the coating liquid, printability without scratching the substrate, and satisfactory efficiency of material utilization.

Following the film formation step by a wet method, a drying step is required. The drying method may be any method as long as the solvent can be eliminated to the extent that the light emitting characteristics are not deteriorated, and can be selected among methods by heating or by vacuum. Taking thermal deterioration of the organic light emitting medium layer into consideration, the heat is preferably not higher than Tg (glass transition point) of each material, and solvent elimination using a reduced state in combination is more preferred.

The hole blocking material and the electron transport material used in the hole blocking layer and the electron transport layer may be any material as long as it is a generally used electron transport material, and the film formation can be carried out by a vacuum vapor deposition method using a low molecular material such as a triazole-based, oxazole-based, oxadiazole-based, silole-based or boron-based low molecular material. Also, these electron transporting materials and these electron transport materials can be formed into a film with a printing method by dissolving in a polymer such as polystyrene, polymethyl methacrylate or polyvinyl carbazole, and preparing a coating liquid for electron transport by dissolving or dispersing in a solvent such as toluene, xylene, acetone, methyl ethyl ketone, methyl isobutyl ketone, cyclohexanone, methanol, ethanol, isopropyl alcohol, ethyl acetate, butyl acetate or water alone, or as a mixed solvent.

The electron injection material for use in the electron injection layer may, in addition to the material similar to those used in the aforementioned electron transport layer, be a salt or oxide of an alkali metal or alkaline earth metal, or the like such as lithium fluoride or lithium oxide, which can be used for the film formation by vacuum evaporation. Also, these electron transporting materials and these electron transport materials can be formed into a film with a printing method by dissolving in a polymer such as polystyrene, polymethyl methacrylate or polyvinyl carbazole, and preparing a coating liquid for electron transport by dissolving or dispersing in a solvent such as toluene, xylene, acetone, methyl ethyl ketone, methyl isobutyl ketone, cyclohexanone, methanol, ethanol, isopropyl alcohol, ethyl acetate, butyl acetate or water alone, or as a mixed solvent.

When the film formation of such layers is carried out by a printing method, the coating can be performed by a printing method such as a relief printing method, an intaglio printing method, a screen printing method, a gravure printing method, a flexography method or an offset lithography method as well as the film formation of the organic light emitting layer. However, the relief printing method is particularly suited for production of the organic EL element, in particular, in light of suitability to the viscosity region of the coating liquid, printability without scratching the substrate, and satisfactory efficiency of material utilization.

As the cathode 104 which is the counter electrode, an elemental metal such as Mg, Al or Yb may be used. Also, for the purpose of achieving both electron injection efficiency and stability, an alloy system of a metal having a low work function with a stable metal, for example, an alloy such as MgAg, AlLi or CuLi, can be used. The method of forming the cathode which can be employed may, depending on the material, be a resistance heating vapor deposition method, an electron beam method, or a sputtering method. The thickness of the cathode is desirably approximately 10 nm to 1000 nm.

Finally, for the purpose of protecting the organic EL layered product from external oxygen or moisture, encapsulation is effected using a glass cap and an adhesion whereby the organic EL element can be obtained. Also, when the transparent substrate has flexibility, a sealing agent and a flexible film are used to carry out the encapsulation.

In FIG. 1, at first, an electrode is formed on a transparent substrate 101 as an anode. However, at first, an electrode is formed on a transparent substrate 101 as a cathode.

In addition, in FIG. 1, a transparent conductive layer 102 is provided on a transparent substrate 101 and the transparent substrate side is a display side. However, it is possible that an opposite electrode to the transparent substrate 101 side is used as a transparent electrode and displaying is performed from the opposite side.

Hereinafter, another example of a display having an organic EL element of the present invention is described referring to FIG. 3.

Figure 3:
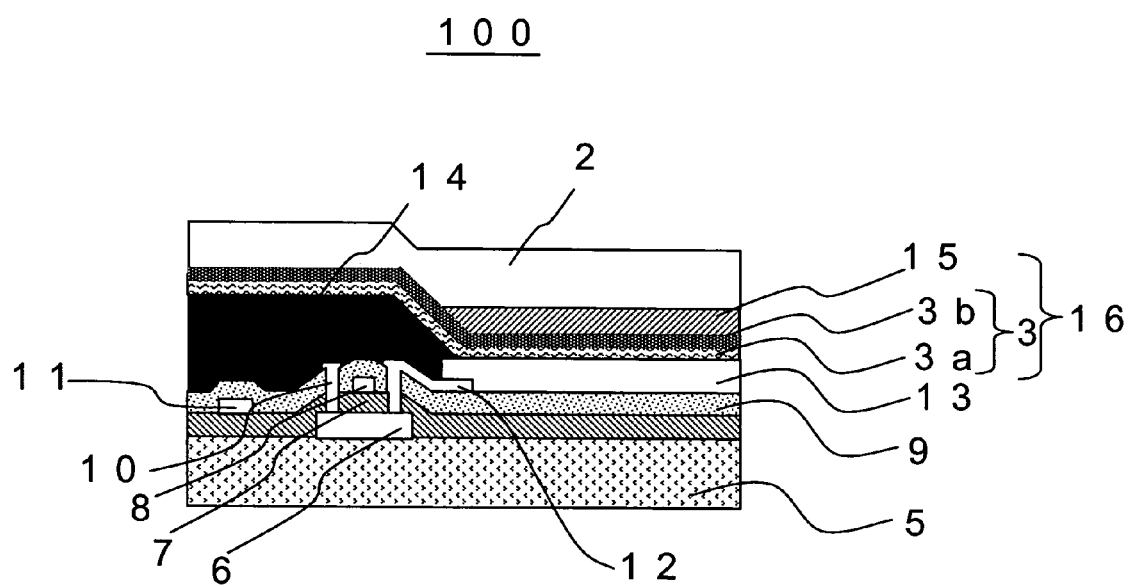
FIG. 3 is a schematic cross-sectional diagram of a display having an organic EL element of an embodiment of the present invention.

A display 100 having an organic EL element of an embodiment of the present invention, the display 100 being shown in FIG. 3, is an active matrix driving type organic EL display having a substrate 5 with a thin film transistor (hereinafter, a thin film transistor may be called TFT), a pixel electrode 13 provided for every pixel, a partition wall 14 which is formed so that the wall sections pixels, a buffer layer 3 including a hole transport layer 3$a$ formed on the pixel electrode 13 and a functional layer 3$b$, an organic light emitting layer 15 formed on the buffer layer 3 and a counter electrode 2 formed on an organic light emitting layer 15.

In a display 100 shown in FIG. 3, an organic light emitting medium layer 16 has a buffer layer including a hole transport layer 3$a$ and a functional layer 3$b$, and a light emitting layer 15.

Figure 4:
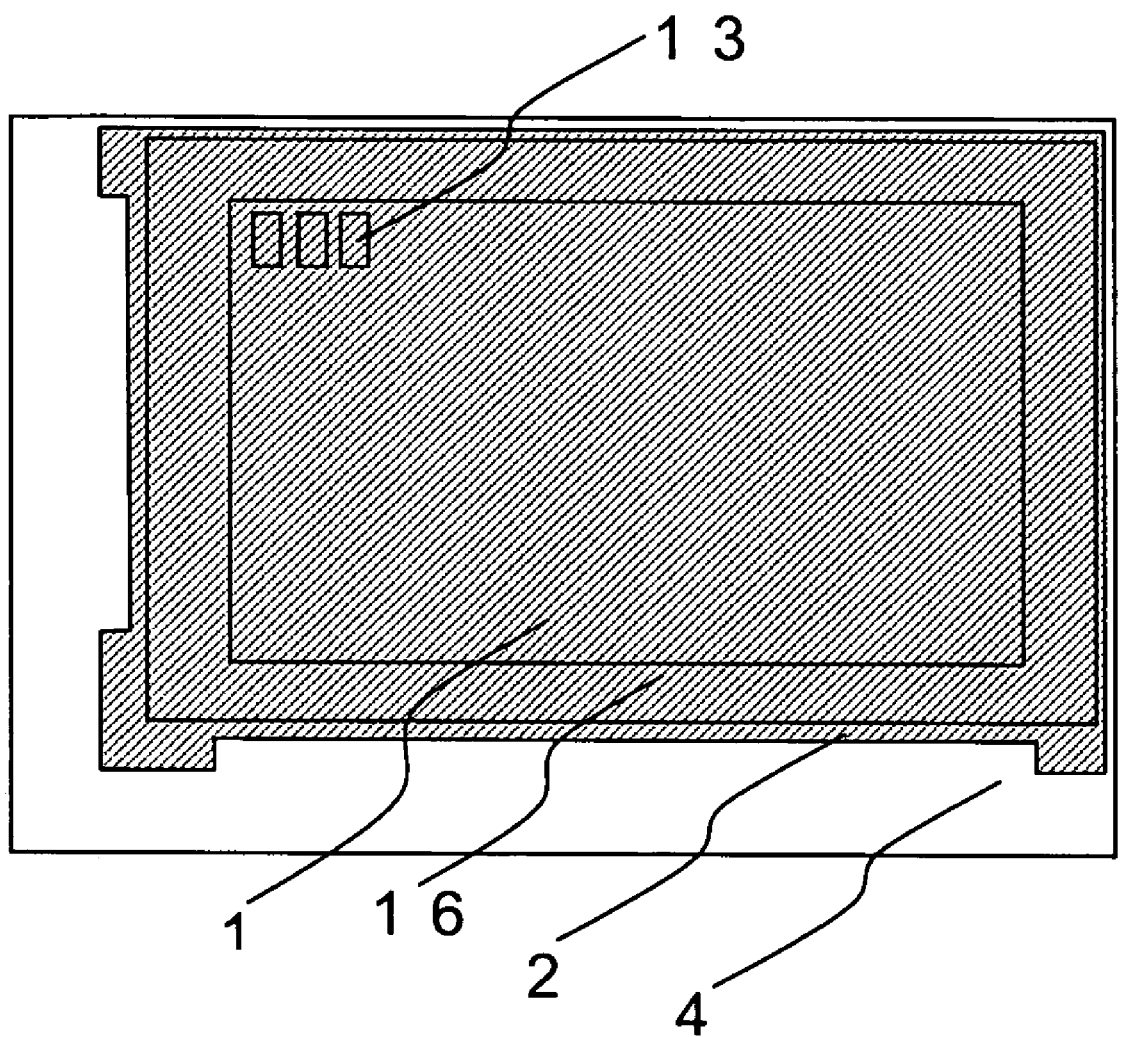
FIG. 4 is a schematic top view of an active matrix driving type organic EL display of an embodiment of the present invention.

FIG. 4 is a schematic top view of FIG. 3, in which a display region 1, a pixel electrode 13, an organic light emitting medium layer 16 and a counter electrode 2 are shown.

[Substrate 5]

As shown in FIG. 3, a substrate (a back plane) 5 used for an active matrix driving type organic EL display 100 of an embodiment of the present invention is provided with a TFT (a thin film transistor) and a pixel electrode 13 wherein the TFT is electrically connected with the pixel electrode 13.

The TFT and the organic EL element formed above the TFT are supported by the substrate 5. The substrate may preferably be excellent in mechanical strength, insulating property and dimensional stability.

For example, the following materials can be used as the substrate 5:

1. glass, quartz, plastic film or sheet such as polypropylene, polyether sulfone, polycarbonate, cyclo olefin polymers, polyarylate, polyamide, polymethyl methacrylate, polyethylene terephthalate and polyethylenenaphthalate;

2. transparent substrate in which plastic film or sheet is laminated by only monolayer or plural layers comprised of the following materials:

metallic oxide such as oxidation silicon and alumina;

metal fluoride such as aluminium fluoride and magnesium fluoride;

metal nitrides such as silicon nitride and aluminum nitride;

metal acid nitride such as oxynitriding silicon;

macromolecule resin film such as acrylic resin, epoxy resin, silicone oil and polyester resin; and metallic foil, sheet or board made of aluminium or stainless, and 3. non-transparent substrate in which plastic film or sheet is laminated by a metal membrane such as aluminium, copper, nickel and stainless.

However, the material for the substrate 5 is not limited to these.

The transparent property of the substrate is decided by the direction in which light comes out. It is necessary for the substrate 5 comprising these materials to avoid entry of moisture to a display 100. For example, an inorganic film is formed on the substrate 5. Alternately, fluorocarbon resin is applied to the substrate 5. That is, it is desirable that exclusion of moisture and hydrophobic processing for the substrate 5 are performed in this way. Particularly it is desirable to lower moisture content and gas transmission coefficient of the substrate 5 to avoid entry of moisture to an organic light emitting media layer 16 (the layer 16 is described below).

For a thin film transistor provided on the substrate 5 in an embodiment of the present invention, well-known thin film transistors can be used. For example, a thin film transistor having the active layer 6 where a source/drain region 10, 12 and a channel area are formed, the gate insulating film 7 and the gate electrode 8 is exemplified. Configuration of a thin film transistor is not limited to this configuration. For example, staggered type, reverse staggered type, top gate type, and coplanar type are exemplified.

Active layer 6 can encompass many embodiments. By way of example only, it can be formed by inorganic semiconductor materials such as amorphous silicon, polycrystalline silicon, crystallite silicon, cadmium selenide and metal oxide, or organic semiconductor materials such as thiophene oligomer, and poly (phenylene vinylene).

A manufacturing method of these active layers is exemplified below: a method performing ion doping after depositing amorphous silicon by plasma CVD method; a method performing ion doping by ion implantation method after forming poly silicon by crystallization of amorphous silicon by solid phase epitaxy after forming amorphous silicon by LPCVD (low pressure CVD) method using $SiH_4$ gas; a method performing ion doping by ion doping method after forming poly silicon by annealing amorphous silicon using a laser such as excimer laser and crystallization of amorphous silicon after forming amorphous silicon by LPCVD method using $Si_2H_6$ gas or PECVD (plasma enhanced CVD) method using $SiH_4$ gas (low temperature process); and a method performing ion doping by ion implantation method after forming a gate electrode 8 of $n^+$ poly silicon on a gate insulating film after forming a gate insulating film by thermal oxidation at a temperature of 1,000 degree Celsius or more after depositing poly silicon by LPCVD or PECVD (high temperature process).

For a gate insulating film 7 in an embodiment of the present invention, a conventional gate insulating film can be used. For example, $SiO_2$ formed by PECVD method or LPCVD method, $SiO_2$ obtained by thermal oxidation of poly silicon film can be used.

For gate electrode 8 in an embodiment of the present invention, a conventional gate electrode can be used. Metal such as aluminum and copper, refractory metal such as titanium, tantalum and tungsten, poly silicon, silicide of refractory metal, or polycide can be used. However, the gate electrode is not limited to these.

For a thin film transistor in an embodiment of the present invention, a single gate structure, a double gate structure, multiple gating configuration having three or more gate electrodes are exemplified. In addition, even LDD configuration and offset configuration are preferable. Even more particularly, two or more thin film transistors may be placed on one pixel.

In some embodiments of the present invention, it is necessary for the thin film transistor to be connected so that thin film transistor functions as a switching element of a display 100. Drain electrode 12 of the thin film transistor is electrically connected with pixel electrodes 13.

[Pixel Electrode 13]

As shown in FIG. 3, in an embodiment of the present invention, pixel electrode 13 is formed on substrate 5. Patterning of pixel electrode 13 is performed if necessary. Pixel electrode 13 may be sectioned by partition wall 14.

Materials of pixel electrode 13 are described below: metal complex oxide such as ITO (indium tin complex oxide), indium zinc complex oxide or zinc aluminium complex oxide; metallic substances such as gold, platinum and chromium; and the particle dispersion membrane in which finely divided particles of the metallic oxide or the metallic substance are dispersed in epoxy resin or acrylic resin. A single-layered body or a laminated material of the above described material can be used. However, materials of pixel electrode 13 are not limited to these.

When a pixel electrode 13 is an anode, it is desirable to select the material such as ITO which has a high work function. In the case of a so-called bottom emission configuration in which light is taken out from a lower side (the substrate 5 side), it is necessary to select a material with translucency as a material of a pixel electrode 13. Metallic substances such as copper or aluminium may be added as a supporting electrode to make an electric wiring electrical resistance of a pixel electrode 13 small if necessary.

In the case of a so-called top emission configuration in which light is taken out from an upper side (an opposite side to the substrate 5 side), it is not necessary to select a material with translucency as a material of a pixel electrode 13. If a material with translucency is used as material of a counter electrode 2, the top emission configuration type element can be manufactured. In addition, a pixel electrode can be used as a cathode. Further, the counter electrode 2 can, at first, be formed on substrate 5. Next, elements other than the counter electrode 2 can be formed on the counter electrode 2.

For a formation method of a pixel electrode 13, the following methods can be used depending on the material: dry methods such as resistance heating evaporation method, electron-beam evaporation technique, reactivity evaporation method, ion plating method and sputtering method; and wet methods such as the gravure process and screen printing. However, a formation method of a pixel electrode 13 is not limited to these.

For a patterning method of a pixel electrode 13, depending on a material and a film formation method, existing patterning methods such as mask evaporation method, photolithography method, wet etching method and dry etching method can be used. In a case where a product with a TFT is used as a substrate, the product with a TFT should be formed so that a pixel electrode is electrically connected to a corresponding pixel in a lower layer.

[Partition Wall 14]

Partition wall 14 can be formed so as to section a light emitting area corresponding to a respective pixel if necessary. It is desirable that the partition wall is formed so as to cover an edge of pixel electrode 13. (See FIG. 3) In an active matrix drive-type organic EL display 100, pixel electrode 13 is generally formed for every pixel and the respective pixel tends to occupy as large an area as possible. Therefore, the most preferable shape of a partition wall 14 to be formed so as to cover an edge of a pixel electrode is basically a grid shape where a partition wall 14 sections at the shortest distance each pixel electrode 13. For a formation method of a partition wall 14, the following conventional method can be used: 1). An inorganic film is uniformly formed on a substrate (with a thin film transistor and a pixel electrode), this substrate is masked with a resist, and dry etching of an inorganic film is performed; or 2). A photosensitive resin is laminated on a substrate, and a predetermined pattern is formed by a photolithography method. However, a formation method of a partition wall 14 is not limited to these. Water-repellent may be added if necessary. By means of irradiating plasma or UV on a partition wall after the formation of a partition wall, a partition wall can be ink repellent.

Height of a partition wall 14 is preferably 0.1 μm-10 μm, more preferably 0.5 μm-2 μm. If a partition wall is higher than 10 μm, a partition wall may prevent a counter electrode 2 from forming and prevent sealing. If a partition wall is lower than 0.1 μm, a partition wall can not perfectly cover an edge of a pixel electrode 13, or color mixture or short circuit between adjacent pixels occurs when an organic light emitting medium layer 16 is formed.

[Organic Light Emitting Medium Layer 16]

An organic light emitting medium layer 16 has a buffer layer 3 including a hole transport layer 3a and a functional layer 3b, and an organic light emitting layer 15. In addition, a structure further including an electron transport layer and an insulating layer can achieve an effect of the present invention. The thickness of the respective layers is not limited, however 0.1 nm-200 nm is preferred. It is desirable that total thickness of all layers in an organic light emitting medium layer 16 be 50 nm-500 nm.

After a partition wall 14 has been formed, a buffer layer 3 can be formed. The buffer layer is comprised of at least two kinds of inorganic materials. The buffer layer 3 may be a layered product of at least two kinds of inorganic materials. The layered product of inorganic materials can be a layered product structure comprised of a hole transport layer 3a and a functional layer 3b.

An oxide, a nitride and a oxynitride of a transition metal, and p-type compound semiconductor can be used for a hole transport layer 103a comprised of an inorganic material. Film thickness of a hole transport layer 103a is arbitrary. However, it is desirable that the film thickness is 0.1 nm-200 nm. In addition, the film thickness of 0.1-70 nm is preferred in view of preventing a rise in a driving voltage. In addition, in the case of a material having a highly insulating property, a good hole transporting property is obtained by forming a film of 0.1-10 nm film thickness. Further, if a band gap of a material is equal to or more than 3.0 eV, the film is almost transparent in a visible light region. Thereby, EL characteristics more superior in chromaticity, luminance and efficiency in light emitting can be obtained.

Examples of an oxide of a transition metal used here include an oxide of chrome (Cr), tungsten (W), vanadium (V), niobium (Nb), tantalum (Ta), molybdenum (Mo), titanium (Ti), zirconium (Zr), hafnium (Hf), scandium (Sc), yttrium (Y), manganese (Mn), iron (Fe), ruthenium (Ru), osmium (Os), cobalt (Co), nickel (Ni), copper (Cu), zinc (Zn) and cadmium (Cd). A compound of a transition metal has a plurality of oxidation numbers. Therefore, there is a plurality of potential levels. Thus, hole injection becomes easy, thereby reduction of a driving voltage becomes possible. Film formation can be performed mainly by a vacuum vapor deposition method or a sputtering method.

Especially, as for molybdenum oxide which is deposited by a vacuum vapor deposition, reduction occurs in a process where molybdenum oxide is heated, sublimate and deposited on a substrate. Therefore, molybdenum oxide has a plurality of potential levels such as oxidation numbers of trivalent-hexavalent. Thereby, hole transporting becomes easy and reduction of a driving voltage becomes possible. "A work function/an electron affinity value" of $MoO_3$ of which valence is largest is 5.4 eV/2.4 eV. That is, $MoO_3$ is suitable for a hole injection layer. Besides, any oxide of a transition metal can be used if an oxide of a transition metal, for example $V_2O_5$ or $WO_3$, has a work function value between an anode and an organic light emitting layer.

In addition, there are many kinds of nitride and many of them are used as a functional material. Film formation can be performed mainly by a sputtering method or a CVD method. There are various compounds such as a material used for a semiconductor and a material having a very high insulating property which are known. However, as a result of various tests, it was found that, in the case of a highly insulating property compound, if the film thickness was equal to or less than about 5 nm, carrier injection became possible. Examples of the compounds are described below. Titanium nitride (TiN) is preferable. TiN is known as a very rigid material and remains stable when heated.

Other than this, magnesium nitride (MgN), molybdenum nitride (MoN), niobium nitride (NbN), tantalum nitride (TaN), vanadium nitride (BaN), zinc nitride (ZnN), zirconium nitride (ZrN), nitriding iron (FeN), copper nitride (CuN), chromium nitride (CrN), yttrium nitride (YN), titanium nitride (TiN) and these composite nitrides can be used.

Examples of an oxynitride of a transition metal used here include an oxynitride of nickel (Ni), tungsten (W), vanadium (V), niobium (Nb), tantalum (Ta), molybdenum (Mo), titanium (Ti), zirconium (Zr) and hafnium (Hf). Film formation of these oxynitrides of transition metals can be performed mainly by a sputtering method or a CVD method.

Further, an organic EL element of the present invention includes an organic EL element in which a hole transport layer 3a is comprised of a p-type compound semiconductor of III-V group element. Especially, as for SiC which is carbide of silicon (Si), a large-sized film formation is easy and control of a hole transporting property by doping is easy. In addition, there is little change of electric characteristics due to a flowing electric current or a temperature and there is no electrochemical reaction with a material of an electrode. Further, it is superior in transparency. In addition, since GaAs which is an arsenide of gallium (Ga) has a work function near a work function of ITO which is used for an anode, GaAs can be used for a hole transport layer. In this case, a film formation is possible by a vacuum vapor deposition method and so on. Besides, any III-V group element compound semiconductors can be used, if the semiconductor has a work function near a work function of an anode material and an electron affinity value of the semiconductor is less than that of a light emitting layer. A film formation thereof can be performed mainly by a vacuum vapor deposition method or a sputtering method.

Here, as shown in FIG. 3, hole transport layer 3a can be continuously formed over a plurality of places between partition walls 14 and a place of partition walls 14. Alternately, hole transport layer 3a can be formed while the hole transport layer 3a is divided by a partition wall 14.

In the case where hole transport layer 3a is continuously formed over a plurality of places between partition walls 14 and a place of partition walls 14 shown in FIG. 3, efficiency in the manufacturing process can be improved. On the other hand, in the case where hole transport layer 3a is formed while the hole transport layer 3a is divided by a partition wall 14, charge's escaping to an adjacent pixel are absolutely prevented.

After a hole transport layer 3a has been formed, a functional layer 3b comprised of an inorganic compound can be formed. An oxide, a nitride and a oxynitride of a transition metal, and a p-type compound semiconductor of III, IV and V group elements can be used for a functional layer 3b comprised of an inorganic material. The film thickness of a functional layer 3b is arbitrary. However, it is desirable that the film thickness is 0.1 nm-200 nm. In addition, the film thickness of 0.1-70 nm is preferred in view of preventing a rise in a driving voltage. In addition, in the case of a material having a highly insulating property, good EL characteristics are obtained by forming a film of 0.1-10 nm film thickness while hole injection to an organic light emitting layer is not prevented. Further, if a band gap of a material is equal to or more than 3.0 eV, the film is almost transparent in a visible light region. Thereby, EL characteristics more superior in chromaticity, luminance and efficiency in light emitting can be obtained.

The same materials as the above-mentioned materials of a hole transport layer 3a can be used for a material of a functional layer 3b comprised of an inorganic material.

In the case where an electron affinity value of a functional layer 3b is smaller than that of an organic light emitting layer 15, a functional layer 3b has an electron blocking function. Thereby, a function layer 3b prevents an electron injected to an organic light emitting layer 15 from escaping to a hole transport layer side. Thus a high efficiency in light emitting can be obtained.

In addition, in the case where a work function value of a functional layer 3b is larger than that of an organic light emitting layer 15, a functional layer 3b has a hole injection function. In this case, good organic EL characteristics having a low driving voltage can be obtained while hole injection to an organic light emitting layer 15 is not inhibited.

Figure 6:
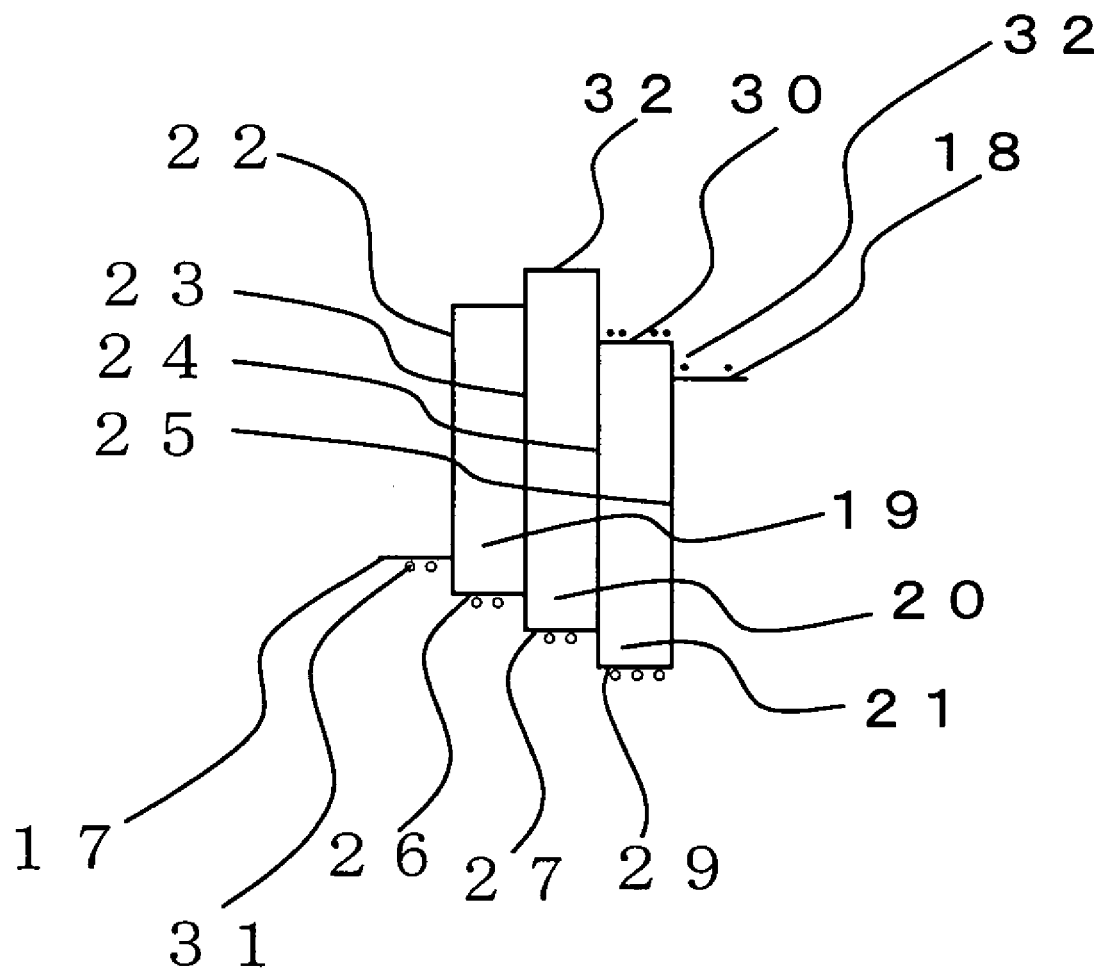
FIG. 6 is an energy explanatory diagram for explaining a mechanism of an organic EL element of an embodiment of the present invention.

Hereinafter, an effect or mechanism of a buffer layer comprised of a functional layer and a hole transport layer will be explained. FIG. 6 is an explanatory diagram about energy in an organic EL element of an embodiment of the present invention. In FIG. 6, 17 is a line showing an energy level of an anode; 18 is a line showing an energy level of a cathode; 19 shows a part corresponding to a hole transport layer; 20 shows a part corresponding to a functional layer; and 21 shows a part corresponding to an organic light emitting layer. 22 is a line showing an interface between an anode and a hole transport layer; 23 is a line showing an interface between a hole transport layer and a functional layer; 24 is a line showing an interface between a functional layer and an organic light emitting layer; 25 is a line showing an interface between an organic light emitting layer and a cathode; 26 is an energy level of a work function of a hole transport layer; 27 is a line showing a work function value of a functional layer; 28 is a line showing an electron affinity value of a functional layer; 29 is a line showing a work function value of an organic light emitting layer; 30 is a line showing an electron affinity value of an organic light emitting layer; 31 is a hole; and 32 is an electron. In addition, FIG. 6 shown here is a simplified and modeled diagram.

In a diagram such as FIG. 6, a hole 31 in a lower part has a higher energy, and an electron 32 in a higher part has a higher energy. Therefore, a hole 31 inside an organic light emitting layer 21 has a higher energy than a hole 31 in an anode. In this case, it is necessary for a hole 31 having a lower energy in an anode to be provided with an energy corresponding to the energy difference from outside so that the hole 31 in the anode is injected to the organic light emitting layer 21

Here, if a plurality of layers having energy between energy value of a work function value of an anode and that of an organic light emitting layer are inserted, there are smaller energy differences between the respective layers. Thereby, hole injection becomes easy. That is, reduction of a driving voltage becomes possible.

Electron 32 in a cathode is injected at the same energy level as an electron affinity value 30 of an organic light emitting layer. Thereafter, light is emitted when the electron recombines with a hole 31 inside an organic light emitting layer 21. At this time, in the case where an electron affinity value of a layer at an anode side of an organic light emitting layer 21, the layer at the anode side being adjacent to the organic light emitting layer 21, is at a lower part than an electron affinity value 30 of an organic light emitting layer, an electron 32 injected to an organic light emitting layer 21 tends to escape to an anode side without recombining inside an organic light emitting layer 21. Then, an electron affinity value of a layer at an anode side of an organic light emitting layer 21, the layer at the anode side being adjacent to the organic light emitting layer 21, has a higher energy. Thereby, it is possible for more electrons 32 to be made to remain inside an organic light emitting layer 21. Therefore, a high efficiency in light emitting can be achieved.

For example, "a work function value/an electron affinity value" of NiO is 5.4 eV/1.9 eV. That is, NiO is a material superior in both a hole injection function and an electron blocking function. Therefore, NiO is a material suitable for a functional layer. Apart from this, the above-mentioned SiC can be used for a functional layer.

Here, as shown in FIG. 3, a functional layer 3b as well as a hole transport layer can be continuously formed over a plurality of places between partition walls 14 and a place of partition walls 14. Alternately, a functional layer 3b can be formed while the functional layer 3b is divided by a partition wall 14. In the case where a functional layer 3b is continuously formed over a plurality of places between partition walls 14 and a place of partition walls 14, efficiency in a manufacturing process can be improved.

If a buffer layer is a layered product structure including a hole transport layer and a functional layer comprised of an inorganic compound, a uniform buffer layer without film thickness ununiformity can be obtained, wherein the film thickness ununiformity may occur in the case of a wet process. Further, the use of a buffer layer comprised of a highly stable inorganic material makes it possible to obtain a polymer organic EL element having a high reliability.

After a buffer layer 3 has been formed, an organic light emitting layer 15 can be formed. An organic light emitting layer 15 in an embodiment of the present invention is a layer which emits light if an electric current flow through the layer. Examples of organic light-emitting materials for forming the organic light emitting layer 15 include; 1. organic light-emitting materials in which light emitting color materials such as coumarin system, perylene system, pyran system, anthrone system, porphyrin system, quinacridone system, N,N'-dialkyl-substituted quinacridone system, naphthalimide system, N,N'-diaryl-substituted pyrrolopyrrole system and iridium complexes are dispersed in polymers such as polystyrene, polymethyl methacrylate and polyvinyl carbazole; 2. and polymeric organic light-emitting materials of polyarylene system, polyarylene vinylene system and polyfluorene system.

There are many of these light emitting materials having "a work function value/an electron affinity value" of (4-6 eV)/(2-6 eV). A material having a good efficiency can be selected while energy matching of respective functional layers is considered.

An organic light emitting ink is prepared by dissolving or stably dispersing these organic light emitting materials in a solvent. For a solvent dissolving or dispersing an organic light emitting material, toluene, xylene, acetone, anisole, methyl ethyl ketone, methyl isobutyl ketone and cyclohexanone can be used. The above-mentioned solvent may be used alone. In addition, the above mentioned solvent may be used as a mixed solvent. Above all, an aromatic organic solvent such as toluene, xylene and anisole is preferred from the aspect of solubility of an organic light emitting material. In addition, a surface active agent, an antioxidant, a viscosity modifier and an ultraviolet absorber may be added to an organic light emitting ink if necessary.

As for a light emitting layer provided on respective pixel portions, light emitting layers which emit light of an identical color can be arranged. In this case, a display of a single color can be manufactured. In the case where a color image is displayed, it is necessary to arrange pattern-shaped light emitting layers which emit different color lights from each other at respective pixel portions. In general, the colors are red (R), green (G) and blue (b) which are light's three primary colors. In addition, yellow (Y), Cyan (C) and Magenta (M) which are complementary colors thereof can be used.

It is desirable that an organic light emitting layer 15 be formed by a wet process using the above-mentioned organic light emitting ink, because there is an advantage in making a large-sized display or in costs when the organic light emitting layer 15 is formed by such a method. Examples of a wet method include a spin coat method, a dip coat method, a slit coat method, an ink jet printing method or the like. However, a printing method is especially preferred since the printing method is a simple process and makes it possible to perform a highly defined patterning.

When the film formation of an organic light emitting layer is carried out by a printing method, the coating can be performed by a printing method such as a relief printing method, an intaglio printing method, a screen printing method, a gravure printing method, a flexography method or an offset lithography method. However, the relief printing method is particularly suited for production of the organic EL element, in particular, in light of suitability to the viscosity region of the coating liquid, printability without scratching the substrate, and satisfactory efficiency of material utilization.

Figure 7:
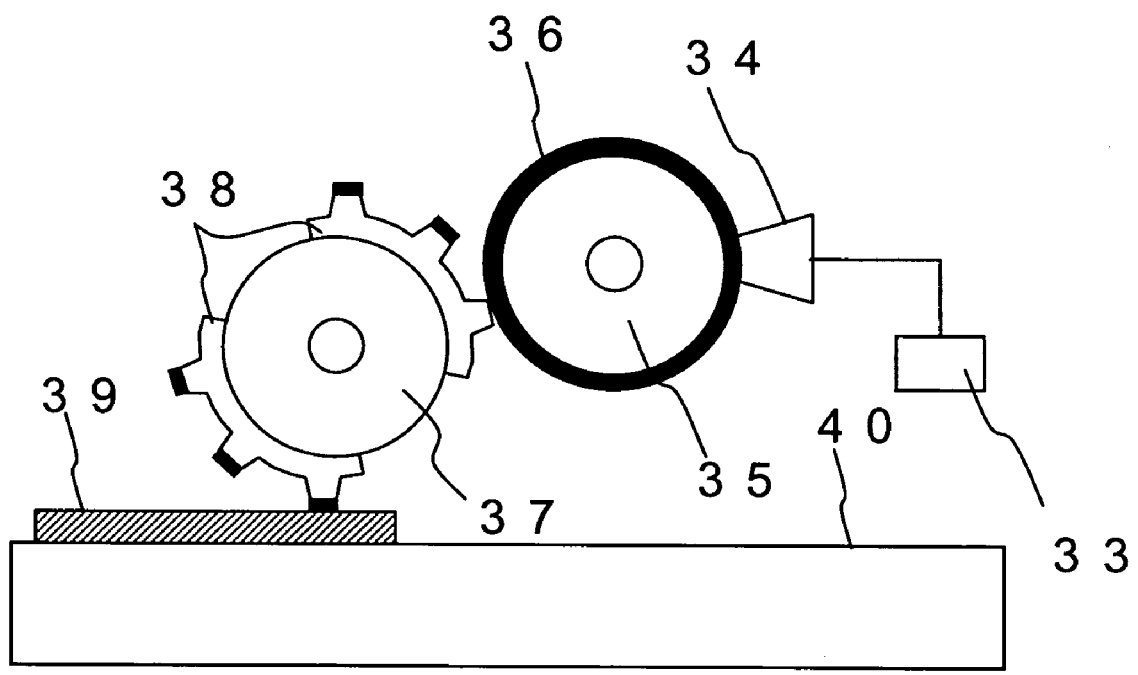
FIG. 7 is a schematic diagram of a relief printing apparatus used in an embodiment of the present invention.

FIG. 7 shows a schematic diagram of a relief printing apparatus 300 which pattern-prints an organic light emitting ink comprising an organic light emitting material on a substrate to be printed 39 on which pixel electrodes 13, partition walls 14 and a buffer layer are formed. This relief printing apparatus 300 used in an embodiment of the present invention has an ink tank 33, an ink chamber 34, an anilox roll 35 and a plate cylinder 38 on which a relief printing plate is equipped. An organic light emitting ink which is diluted by a solvent is taken to the ink tank 33. An organic light emitting ink is sent into the ink chamber 34 from the ink tank 33. The anilox roll 35 makes contact with an ink feed section of the ink chamber 34, and it is rotatably supported.

According to rotation of the anilox roll 35, an ink layer 36 comprising an organic light emitting ink supplied on an anilox roll face becomes uniform. This ink layer transfers onto projection parts of the plate 38 mounted on a printing cylinder 37 which is rotationally driven in proximity to the anilox roll. A substrate to be printed 39 on which pixel electrodes 13 (transparent electrodes) and a buffer layer are formed is arranged on a flat base 40. And ink on projection parts of the plate 38 is printed on the substrate to be printed 39. And ink is dried if necessary. An organic light emitting layer 15 is formed on the substrate to be printed 39 in this way.

Further, after an organic light emitting layer 15 has been formed, a hole blocking layer, an electron transport layer, an electron injection layer or the like can be preferably formed. The hole blocking material and the electron transport material used in the hole blocking layer and the electron transport layer may be any material as long as it is a generally used electron transport material, and the film formation can be carried out by a vacuum vapor deposition method using a low molecular material such as a triazole-based, oxazole-based, oxadiazole-based, silole-based or boron-based low molecular material. Also, these electron transporting materials and these electron transport materials can be formed into a film with a printing method by dissolving in a polymer such as polystyrene, polymethyl methacrylate or polyvinyl carbazole, and preparing a coating liquid for electron transport by dissolving or dispersing in a solvent such as toluene, xylene, acetone, methyl ethyl ketone, methyl isobutyl ketone, cyclohexanone, methanol, ethanol, isopropyl alcohol, ethyl acetate, butyl acetate or water alone, or as a mixed solvent.

The electron injection material for use in the electron injection layer may be, in addition to the material similar to those used in the aforementioned electron transport layer, a salt or oxide of an alkali metal or alkaline earth metal, or the like such as lithium fluoride or lithium oxide, which can be used for the film formation by vacuum evaporation. Also, these electron transporting materials and these electron transport materials can be formed into a film with a printing method by dissolving in a polymer such as polystyrene, polymethyl methacrylate or polyvinyl carbazole, and preparing a coating liquid for electron transport by dissolving or dispersing in a solvent such as toluene, xylene, acetone, methyl ethyl ketone, methyl isobutyl ketone, cyclohexanone, methanol, ethanol, isopropyl alcohol, ethyl acetate, butyl acetate or water alone, or as a mixed solvent.

When the film formation of these layers is carried out by a printing method, the coating can be performed by a printing method such as a relief printing method, an intaglio printing method, a screen printing method, a gravure printing method, a flexography method or an offset lithography method the same as the film formation of an organic light emitting layer 15. However, the relief printing method is particularly suited for production of the organic EL element, in particular, in light of suitability to the viscosity region of the coating liquid, printability without scratching the substrate, and satisfactory efficiency of material utilization.

[Counter Electrode 2]

Next, counter electrode 2 can be formed as illustrated by FIG. 3. When a counter electrode is a cathode, the material discussed below can be used. The material can be of a type with high electron injection efficiency to an organic light emitting layer 15 and low work function.

In some embodiments, counter electrode 2 can include a metal such as Mg, Al, Yb. In addition, the following layer stack may be put in a boundary surface of the organic light emitting medium layer 16. The layer stack is a stack with a chemical compound of about 1 nm thicknesses such as Li and oxidation Li and LiF, and Al and Cu having stability and/or high conductivity. Stability should be balanced with electron injection efficiency. Therefore an alloy system may be used. An alloy of one or more kinds of metal such as Li, Mg, Ca, Sr, La, Ce, Er, Eu, Sc, Y, and Yb that have a low work function, and a metallic element such as Ag, Al, and Cu which are stable can be used. In some embodiments, alloys such as MgAg, AlLi, and CuLi can be used.

For the method for forming counter electrode 2, depending on the material, a resistance heating evaporation coating method, an electron beam-evaporation coating method, a reactive deposition method, an ion plating method, or a sputtering method can be used. However, the method for forming counter electrode 2 is not limited to these.

Figure 5:
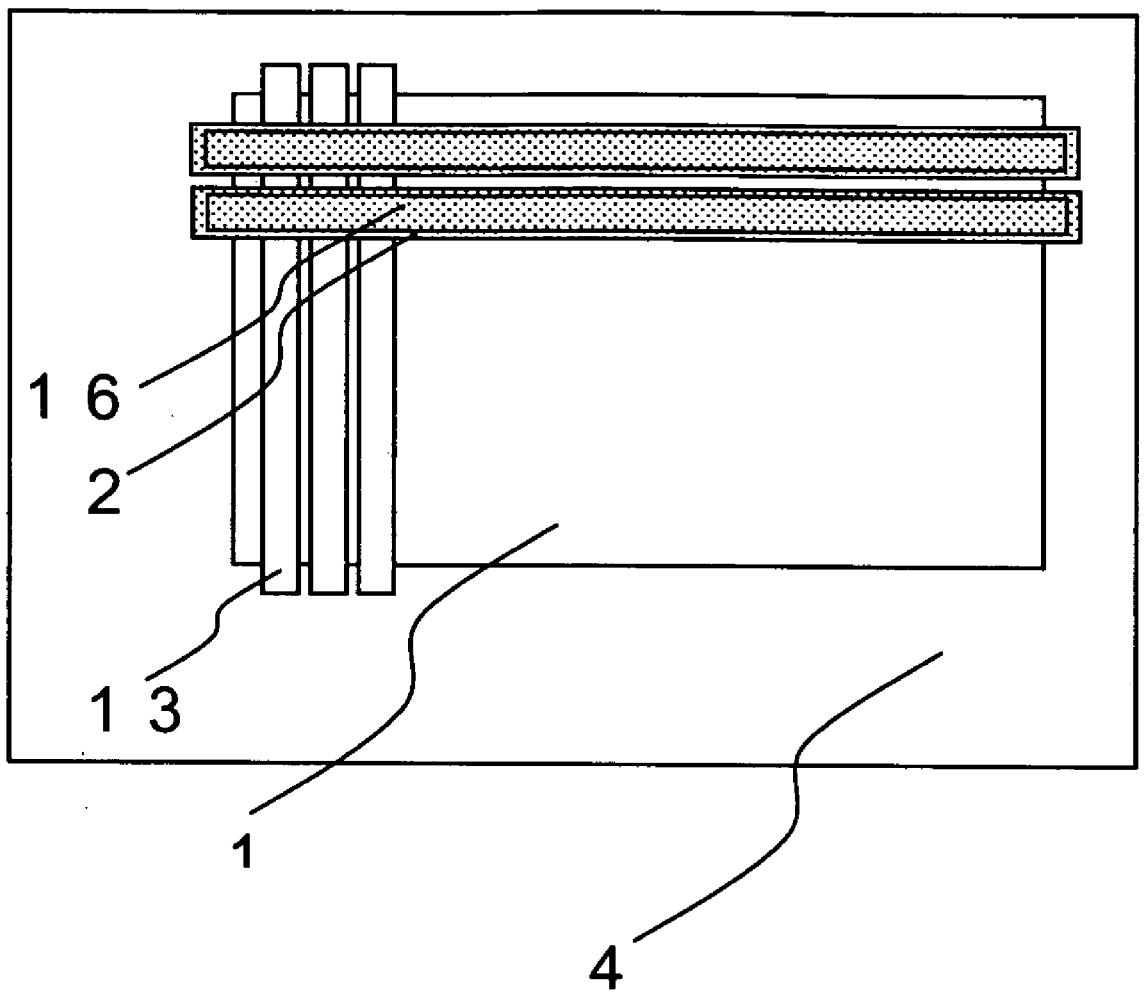
FIG. 5 is a schematic top view of a passive matrix driving type organic EL display of an embodiment of the present invention.

An active matrix-drive type organic EL display 100 was described above. However, the present invention is suitable for a passive matrix-drive type organic EL display 200, comprising a pixel electrode 13, a counter electrode 2 and an organic light emitting medium layer 16 between both electrodes, wherein both electrodes are an anode line and a cathode line which cross each other respectively. For example, as shown in FIG. 5, by providing a counter electrode 2 at an upper part of a stripe-shaped organic light emitting medium layer 16, the same effect as the active matrix-drive type organic EL display 100 can be achieved. Here, FIG. 5 is a schematic top view.

[Sealing Body]

As a display 100, a light emitting material is sandwiched between electrodes (pixel electrode 13 and counter electrode 2), and it can emit light by applying an electric current. However, an organic light emitting material deteriorates easily by means of atmospheric moisture and oxygen. Thus a seal (not illustrated) to block off an organic light emitting layer and the like from the outside can be usually provided. For example, a sealing body can be manufactured by providing a resin layer on a sealing medium.

For a sealing medium, it is necessary for the permeability of moisture and oxygen to be low. In addition, as an example of a material for a sealing medium, ceramics such as alumina, silicon nitride and boron nitride, glass such as no-alkali glass and alkali glass, quartz, and humidity resistance film are exemplified. For example, the following humidity resistance film is exemplified: a film in which SiOx is formed by CVD method on both sides thereof; a film in which a film having a low permeability of moisture and oxygen and a hydrophilic film are laminated; and a film in which water absorption agent was applied thereon, the film having a low permeability of moisture and oxygen. It is preferable for water a vapor permeation rate of the humidity resistance film to be equal to or less than $10^{-6}$ $g/m^2/day$.

For example, for a resin layer, the following material can be used: A photo-curing adhesive property resin, a heat curing adhesive property resin and two fluid hardening adhesive property resins comprising an epoxy type resin, acrylic resin, silicone oil and the like, acrylic resin such as ethylene ethylacrylate (EEA) polymer, vinyl resins such as ethylene vinyl acetate (EVA), thermoplastic resin such as polyamide, a synthetic rubber, thermoplasticity adhesive property resins such as acid denatured substances of polyethylen or polypropylene.

An example of a method for forming a resin layer on a sealing medium is shown below: solvent solution method, pushing out laminate method, fusion/hot melt method, calender method, discharge jet application method, screen printing, vacuum laminate method and heated roll laminate method. However, the method for forming a resin layer is not limited to these. A material having hygroscopicity and a property to absorb oxygen can be incorporated into a resin layer if necessary. The thickness of a resin layer formed on a sealing medium is decided by the size and configuration of a sealed display 100. About 5-500 μm is desirable for the thickness of a resin layer. In addition, here, a resin layer is formed on a sealing medium. However, a resin layer is directly formed on a display 100 side.

Finally, in a sealing room, a display 100 is affixed to a sealing body. When it is a two layer construction consisting of a sealing medium and a resin layer of thermoplastic resin, contact bonding should be performed only by a heating roller.

In the case of a heat curing type adhesion resin, it is desirable that a heat curing type adhesion resin be heated and hardened at a curing temperature after the resin is attached by pressure using a heating roller. In the case of a photo-curing-related adhesion resin, it is sealed by pressure using a roller. Thereafter, a photo-curing-related adhesion resin can be cured by irradiating light.

Since the present invention has the above-mentioned structure, a uniform buffer layer without an ununiform film thickness can be obtained wherein such an ununiform film thickness may occur by a wet process.

In addition, since the present invention has the above-mentioned structure, a uniform buffer layer without an ununiform film thickness can be obtained while elution between films and mixture of a layer with another layer do not occur, wherein the elution and the mixture may occur in the case where a buffer layer is formed by a wet process using a polymer, thereafter an organic light emitting layer is formed.

Further, the use of a buffer layer comprised of an inorganic material having a high resistance and a high stability makes it possible to obtain a polymer organic EL element having a high reliability.

In addition, in the case where a buffer layer has a layered product structure comprised of a hole transport layer and a functional layer of an inorganic compound, a film formation of a hole transport layer and a functional layer can be performed at the same time by a dry process, wherein it is not necessary for both layers to be separately coated for every pixel. Thereby, significant reductions in the number of processes and costs are possible.

In addition, in the case where a buffer layer has a layered product structure comprised of a hole transport layer and an electron blocking layer of an inorganic compound, a film formation of a hole transport layer and an electron blocking layer can be performed at the same time by a dry process, wherein it is not necessary for both layers to be separately coated for every pixel. Thereby, significant reductions in the number of processes and costs are possible.

In addition, since an organic light emitting layer is formed by a wet method between an inorganic layer formed by a dry process and an electrode, reduction of short circuits becomes possible. Thereby, an organic EL element having a high performance can be obtained.

EXAMPLES

Hereinafter, examples of an organic EL element of the present invention are described, however the present invention is not limited to these.

Example 1

Figure 2:
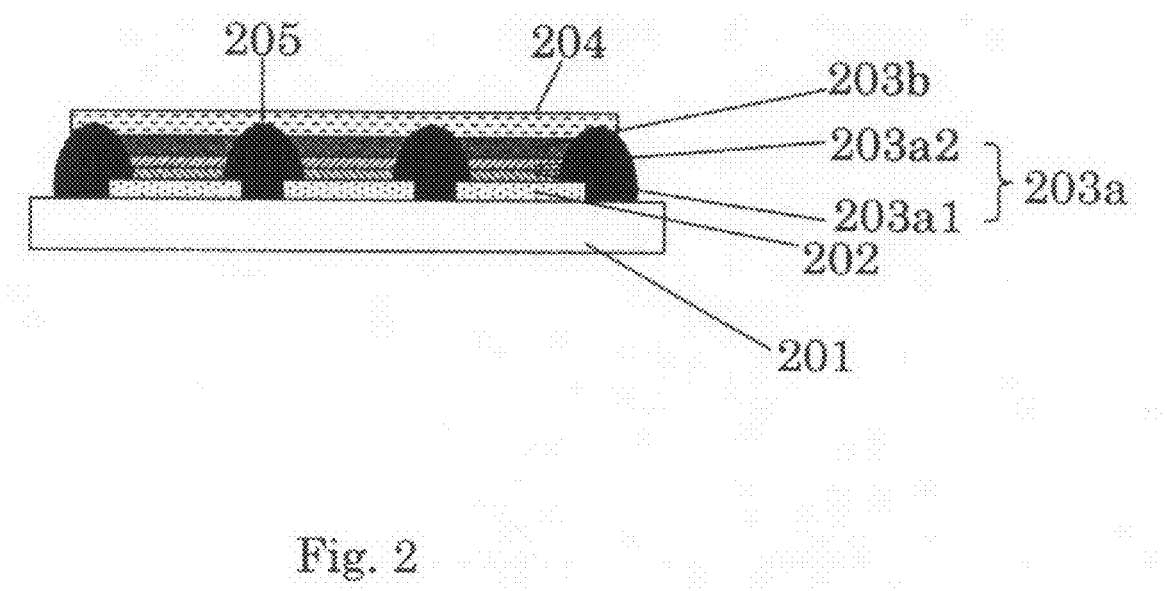
FIG. 2 is an explanatory cross-sectional diagram showing an example of the present invention.

As shown in FIG. 2, a glass square substrate having 0.7 mm thickness and 100 mm side length was prepared as a transparent substrate 201. ITO lines having a pitch of 800·m (L/S=700/100) were formed thereon as transparent electrodes 202. Thereafter, an insulating partition wall 205 covering an end of ITO was formed after patterning of an insulating resist was performed by a photolithography method.

A hole transport layer 203a1 was formed on a transparent electrode by depositing GaAs as a buffer layer to 30 nm thickness by a vacuum vapor deposition method. Thereafter, an electron blocking layer 203a2 was formed thereon by depositing NiO as a buffer layer to 100 nm thickness by a vacuum vapor deposition.

Subsequently, pattern formation was carried out using a 1 vol % PPV-based polymer material, 84 vol % toluene and 15 vol % anisole as the organic light emitting material by a relief printing method, whereby an organic light emitting layer 203b was obtained. Finally, after pattern formation of MgAg as a counter electrode 204 by a binary vapor deposition method in stripes, with 800 μm pitch (L/S=700/100), so as to be perpendicular to the transparent conductive layer 202 and give a thickness of 150 nm, encapsulation was conducted using a glass cap and an adhesive to produce the organic EL element of a passive driving type.

The obtained passive type organic EL element achieved 1000 cd/m$^2$ at 3.5 V. A lifetime was 4500 hrs from an initial brightness of 500 cd/m$^2$. Here, a lifetime means a time to reach a half of the initial brightness.

Example 2

A passive driving type organic EL element was manufactured by the same way as Example 1 except that SiC was deposited to 30 nm thickness as a hole transport layer 203a by a vacuum vapor deposition method, thereafter MoO$_3$ was deposited to 4 nm thickness as an electron blocking layer by a vacuum vapor deposition method. The obtained passive type organic EL element achieved 1100 cd/m$^2$ at 3.5 V. A lifetime was 5200 hrs from an initial brightness of 500 cd/m$^2$.

Example 3

As shown in FIG. 3, an active matrix substrate was used which comprised: a thin film transistor, provided on a substrate 5, which functioned as a switching element; and a pixel electrode 13, provided over the transistor. As for the size of the substrate 5, the diagonal size was 5 inches and the number of pixels was 320*240.

A partition wall 14 was formed so that its shape allowed it to cover an end of the pixel electrode 13 provided on this substrate 5 and to section pixels. The partition wall 14 was formed by the following processes: a positive resist (ZWD6216-6: a product of ZEON CORPORATION) was formed on the entire surface of the substrate 5 by a spin coater so that the thickness of the resist was 2·m; and the partition wall having a width of 40·m was formed by patterning using a photolithography method. In this way, the pixel region was sectioned so that the number of sub pixel was 960×240 dot and the pitch was 0.12 mm×0.36 mm.

A pattern of V$_2$O$_5$ was deposited on the pixel electrode 13 to 30 nm thickness as a hole transport layer 3a by a vacuum vapor deposition method using a shadow mask. Deposition was performed using a metal mask of 120 mm×100 mm size having openings so that deposition was performed over the entire display region.

Next, a pattern of NiO was deposited to 10 nm thickness as a functional layer 3b on the hole transport layer 3a by a vacuum vapor deposition method using a shadow mask. Deposition was performed using a metal mask of 120 mm×100 mm size having openings so that deposition was performed over the entire display region, by the same way as deposition of the hole transport layer.

After the substrate to be printed 39 having the pixel electrode 13, the partition wall 14, the hole transport layer 3a and the functional layer 3b on the substrate 5 had been set on a relief printing machine 300 as shown in FIG. 7, an organic light emitting layer 15 was printed by a relief printing method on the functional layer 3 between partition walls 14 by using an organic light emitting ink in which an organic light emitting material comprising polyphenylene vinylene derivative was dissolved in toluene, wherein the concentration of a polyphenylene vinylene derivative was 1%. In this case, an anilox roll of 150 lines/inch and a photosensitive resin printing plate which was developable by water were used. The film thickness of an organic light emitting layer after printing and drying was 80 nm.

Thereafter, a Ca film was deposited to 20 nm thickness as a counter electrode 2 by a vacuum vapor deposition method using a metal mask of 120 mm×100 mm size having openings. Thereafter, Al was deposited to 150 nm thickness using a metal mask of 124 mm×104 mm size having openings.

A glass plate as a transparent sealing medium was put on the substrate so as to cover all light emitting areas, thereafter sealing was performed by curing an adhesive by heating at about 90° C. for 1 hr. When an active matrix-drive type organic EL display 100 (FIG. 4) obtained in this way was driven, 1000 cd/m$^2$ at 3.5 V was achieved. Further, a lifetime was 4500 hrs from an initial brightness of 500 cd/m$^2$.

Example 4

A sample of example 4 was manufactured by the same processes as example 3, however hole transport layer 3a or the like had not yet been formed. A pattern of SiC was deposited to 30 nm thickness as a hole transport layer 3a by a vacuum vapor deposition method using a shadow mask. Deposition was performed using a metal mask of 120 mm×100 mm size having openings so that deposition was performed over the entire display region. The same as the hole transport layer, a pattern of MoO$_3$ was deposited to 5 nm thickness as a functional layer 3b by a vacuum vapor deposition method using a shadow mask. In addition, an organic light emitting layer 15 was formed by the same process as example 1.

Thereafter, a Ca film was deposited to 20 nm thickness as a counter electrode 2 by a vacuum vapor deposition method using a metal mask of 120 mm×100 mm size having openings. Thereafter, Al was deposited to 150 nm thickness using a metal mask of 124 mm×104 mm size having openings.

A glass plate as a transparent sealing medium was put on the substrate so as to cover all light emitting areas, thereafter sealing was performed by curing an adhesive by heating at about 90° C. for 1 hr. When an active matrix-drive type organic EL display 100 obtained in this way was driven, 1100 cd/m$^2$ at 3.3 V was achieved. Further, a lifetime was 5200 hrs from an initial brightness of 500 cd/m$^2$.

Example 5

A sample of example 5 was manufactured by the same processes as example 3, however hole transport layer 3a or the like had not yet been formed. A pattern of MoO$_3$ was deposited to 30 nm thickness as a hole transport layer 3a by a vacuum vapor deposition method using a shadow mask. Deposition was performed using a metal mask of 120 mm×100 mm size having openings so that deposition was performed over the entire display region. The same as the hole transport layer, a pattern of $WO_3$ was deposited to 5 nm thickness as a functional layer 3b by a vacuum vapor deposition method using a shadow mask. In addition, an organic light emitting layer 15 was formed by the same process as example 1.

Thereafter, a Ca film was deposited to 20 nm thickness as a counter electrode 2 by a vacuum vapor deposition method using a metal mask of 120 mm×100 mm size having openings. Thereafter, Al was deposited to 150 nm thickness using a metal mask of 124 mm×104 mm size having openings.

A glass plate as a transparent sealing medium was put on the substrate so as to cover all light emitting areas, thereafter sealing was performed by curing an adhesive by heating at about 90° C. for 1 hr. When an active matrix-drive type organic EL display 100 obtained in this way was driven, 1100 $cd/m^2$ at 3.3 V was achieved. Further, a lifetime was 5200 hrs from an initial brightness of 500 $cd/m^2$.

Comparative Example 1

A sample of comparative example 1 was manufactured by the same method as example 1 except that only GaAs of a hole transport layer 203a was deposited to 30 nm thickness as a buffer layer.

A driving voltage of the obtained passive type organic EL element was nearly equal to the driving voltage of the element of example 1. However, in comparative example 1, luminance was low for the electric current density. That is, it was found that part of the electric current did not contribute to light emittance. Since the electric current was in excess and the element had a low luminous efficiency, a lifetime was 700 hrs from an initial brightness of 500 $cd/m^2$. The period was short.

Comparative Example 2

A sample of comparative example 2 was manufactured by the same method as example 2 except that only SiC of a hole transport layer 203a was deposited to 30 nm thickness as a buffer layer.

A driving voltage of the obtained passive type organic EL element was nearly equal to the driving voltage of the element of example 2. However, in comparative example 2, luminance was low for the electric current density. That is, it was found that part of the electric current did not contribute to light emittance. Since the electric current was in excess and the element had a low luminous efficiency, a lifetime was 900 hrs from an initial brightness of 500 $cd/m^2$. The period was short.

Comparative Example 3

A sample of comparative example 3 was manufactured by the same method as example 3 except that only $V_2O_5$ of a hole transport layer 3a was deposited to 30 nm thickness as a buffer layer.

When the obtained active matrix driving type organic EL display was driven, the driving voltage of the element of comparative example 3 was nearly equal to the driving voltage of the element of example 2. However, in comparative example 3, luminance was low for the electric current density. That is, it was found that part of the electric current did not contribute to light emittance. Since the electric current was in excess and the element had a low luminous efficiency, a lifetime was 700 hrs from an initial brightness of 500 $cd/m^2$. The period was short.

Comparative Example 4

A sample of comparative example 4 was manufactured by the same method as example 4 except that only SiC of a hole transport layer 3a was deposited to 30 nm thickness as a buffer layer.

When the obtained active matrix driving type organic EL display was driven, the driving voltage of the element of comparative example 4 was nearly equal to the driving voltage of the element of example 4. However, in comparative example 4, luminance was low for the electric current density. That is, it was found that part of the electric current did not contribute to light emittance. Since the electric current was in excess and the element had a low luminous efficiency, a lifetime was 900 hrs from an initial brightness of 500 $cd/m^2$. The period was short.

Comparative Example 5

A sample of comparative example 5 was manufactured by the same method as example 5 except that only $MoO_3$ of a hole transport layer 3a was deposited to 30 nm thickness as a buffer layer.

When the obtained active matrix driving type organic EL display 100 was driven, the driving voltage at an emitted light of 1200 $cd/m^2$ was 4.5 V and was higher than Example 5. In addition, luminance was low for the electric current density. This was a reduction in luminous efficiency. A lifetime was 7200 hrs from an initial brightness of 500 $cd/m^2$.

What is claimed is:

1. An organic electroluminescence element, comprising:
   an anode;
   a cathode; and
   an organic light emitting medium layer including a buffer layer and an organic light emitting layer, said organic light emitting medium layer being between said anode and said cathode, and said buffer layer including at least two kinds of inorganic material,
   wherein said buffer layer is a layered product including at least two kinds of inorganic material,
   wherein said layered product includes a hole transport layer provided on the side of said anode and a functional layer having at least one of the following functions, a hole injection function and an electron blocking function, said functional layer being provided on the side of said organic light emitting layer,
   wherein said functional layer has said electron blocking function, and wherein an absolute value of an electron affinity value of said functional layer is smaller than an absolute value of an electron affinity value of said organic light emitting layer.

2. The organic electroluminescence element according to claim 1,
   wherein said organic light emitting layer includes a polymer compound.

3. The organic electroluminescence element according to claim 1,
   wherein said buffer layer is formed on the side of said anode and said organic light emitting layer is formed on the side of said cathode.

4. The organic electroluminescence element according to claim 1, wherein at least one of said hole transport layer and said functional layer includes an oxide of a transition metal.

5. A display having said organic electroluminescence element according to claim 1 as a display element.

6. An organic electroluminescence element, comprising:
an anode;
a cathode; and
an organic light emitting medium layer including a buffer layer and an organic light emitting layer, said organic light emitting medium layer being between said anode and said cathode, and said buffer layer including at least two kinds of inorganic material,
wherein said buffer layer is a layered product including at least two kinds of inorganic material,
wherein said layered product includes a hole transport layer provided on the side of said anode and a functional layer having at least one of the following functions, a hole injection function and an electron blocking function, said functional layer being provided on the side of said organic light emitting layer,
wherein said functional layer has said hole injection function, and wherein an absolute value of a work function of said functional layer is larger than an absolute value of a work function of said organic light emitting layer.

7. The organic electroluminescence element according to claim 6,
wherein said organic light emitting layer includes a polymer compound.

8. The organic electroluminescence element according to claim 6,
wherein said buffer layer is formed on the side of said anode and said organic light emitting layer is formed on the side of said cathode.

9. The organic electroluminescence element according to claim 6,
wherein at least one of said hole transport layer and said functional layer includes an oxide of a transition metal.

10. A display having said organic electroluminescence element according to claim 6 as a display element.

11. An organic electroluminescence element, comprising:
an anode;
a cathode; and
an organic light emitting medium layer including a buffer layer and an organic light emitting layer, said organic light emitting medium layer being between said anode and said cathode, and said buffer layer including at least two kinds of inorganic material,
wherein said buffer layer is a layered product including at least two kinds of inorganic material,
wherein said layered product includes a hole transport layer provided on the side of said anode and a functional layer having at least one of the following functions, a hole injection function and an electron blocking function, said functional layer being provided on the side of said organic light emitting layer,
wherein at least one of said hole transport layer and said functional layer includes a nitride of a transition metal.

12. An organic electroluminescence element, comprising:
an anode;
a cathode; and
an organic light emitting medium layer including a buffer layer and an organic light emitting layer, said organic light emitting medium layer being between said anode and said cathode, and said buffer layer including at least two kinds of inorganic material,
wherein said buffer layer is a layered product including at least two kinds of inorganic material,
wherein said layered product includes a hole transport layer provided on the side of said anode and a functional layer having at least one of the following functions, a hole injection function and an electron blocking function, said functional layer being provided on the side of said organic light emitting layer,
wherein at least one of said hole transport layer and said functional layer includes an oxynitride of a transition metal.

13. An organic electroluminescence element, comprising:
an anode;
a cathode; and
an organic light emitting medium layer including a buffer layer and an organic light emitting layer, said organic light emitting medium layer being between said anode and said cathode, and said buffer layer including at least two kinds of inorganic material,
wherein said buffer layer is a layered product including at least two kinds of inorganic material,
wherein said layered product includes a hole transport layer provided on the side of said anode and a functional layer having at least one of the following functions, a hole injection function and an electron blocking function, said functional layer being provided on the side of said organic light emitting layer,
wherein at least one of said hole transport layer and said functional layer includes a p-type compound semiconductor of a III-V group element.

14. An organic electroluminescence element, comprising:
an anode;
a cathode; and
an organic light emitting medium layer including a buffer layer and an organic light emitting layer, said organic light emitting medium layer being between said anode and said cathode, and said buffer layer including at least two kinds of inorganic material,
wherein said buffer layer is a layered product including at least two kinds of inorganic material,
wherein said layered product includes a hole transport layer provided on the side of said anode and a functional layer having at least of one the following functions, a hole injection function and an electron blocking function, said functional layer being provided on the side of said organic light emitting layer,
wherein said functional layer includes one of the following, molybdenum oxide, nickel oxide and tungsten oxide.

15. The organic electroluminescence element according to claim 14,
wherein said organic light emitting layer includes a polymer compound.

16. The organic electroluminescence element according to claim 14,
wherein said buffer layer is formed on the side of said anode and said organic light emitting layer is formed on the side of said cathode.

17. An organic electroluminescence element, comprising:
an anode;
a cathode; and
an organic light emitting medium layer including a buffer layer and an organic light emitting layer, said organic light emitting medium layer being between said anode and said cathode, and said buffer layer including at least two kinds of inorganic material,
wherein said buffer layer is a layered product including at least two kinds of inorganic material, wherein said layered product includes a hole transport layer provided on the side of said anode and a functional layer having at least one of the following functions, a hole injection function and an electron blocking function, said functional layer being provided on the side of said organic light emitting layer, wherein said hole transport layer includes one of the following, molybdenum oxide, nickel oxide and tungsten oxide.

18. The organic electroluminescence element according to claim 17, wherein said organic light emitting layer includes a polymer compound.

19. The organic electroluminescence element according to claim 17, wherein said buffer layer is formed on the side of said anode and said organic light emitting layer is formed on the side of said cathode.

20. A display having said organic electroluminescence element according to claim 17 as a display element.

* * * * *